United States Patent
Kusunoki et al.

(10) Patent No.: US 6,333,881 B1
(45) Date of Patent: Dec. 25, 2001

(54) SEMICONDUCTOR MEMORY

(75) Inventors: Takeshi Kusunoki, Tachikawa; Fumihiko Arakawa, Tokorozawa; Hiroaki Nambu, Sagamihara; Kazuo Kanetani, Akishima; Kaname Yamasaki, Kokubunji, all of (JP)

(73) Assignees: Hitachi, Ltd., Tokyo; Hitachi Engineering Co., Ltd., Mobara, both of (JP)

( * ) Notice: Subject to any disclaimer, the term of this patent is extended or adjusted under 35 U.S.C. 154(b) by 0 days.

(21) Appl. No.: 09/604,735

(22) Filed: Jun. 28, 2000

(30) Foreign Application Priority Data

Jun. 30, 1999 (JP) .................................................. 11-184752

(51) Int. Cl.[7] ....................................................... G11C 7/00
(52) U.S. Cl. ...................... 365/203; 365/189.01; 365/154
(58) Field of Search .................................. 365/203, 154, 365/189.01

(56) References Cited

U.S. PATENT DOCUMENTS

| | | | |
|---|---|---|---|
| 4,712,194 | * 12/1987 | Yamaguchi et al. | 365/203 |
| 5,973,972 | * 10/1999 | Kwon et al. | 365/203 |
| 6,075,733 | * 6/2000 | Brown | 365/203 |
| 6,130,846 | * 10/2000 | Hori et al. | 365/203 |

OTHER PUBLICATIONS

1998 IEEE International Solid–State Circuits Conference, Digest Of Technical Papers, pp. 358–(1998).

* cited by examiner

Primary Examiner—Huan Hoang
(74) Attorney, Agent, or Firm—Antonelli, Terry, Stout & Kraus, LLP

(57) ABSTRACT

One of the factors determining cycle time of an SRAM is recovery time of a bit line after writing. When the size of a precharge PMOS transistor is increased to shorten the recovery time, delay time which is caused by making the precharge PMOS transistors non-conductive at the time of read operation, that is, access time increases. To avoid this, a semiconductor memory is provided with a second precharge circuit in addition to the conventional bit line precharge circuit. The second precharge circuit operates upon detection of completion of writing and stops operation when it detects that the bit line is precharged to a high potential. Consequently, the recovery time after write operation is shortened and the cycle time is reduced without increasing the access time.

13 Claims, 6 Drawing Sheets

SEMICONDUCTOR MEMORY

BACKGROUND OF THE INVENTION

The present invention relates to a semiconductor memory and, more particularly, to a semiconductor memory having a precharge circuit for write operation, which is effective to shorten recovery time after writing data to an SRAM and to reduce cycle time.

In an SRAM (Static Random Access Memory), recovery time (time required to make a bit line at a high potential to set a potential difference to zero after write operation) is one of the factors which determines the cycle time. FIG. 2 shows an example of a write circuit and a bit line precharge circuit in a conventional SRAM. Such a conventional technique is disclosed, for example, in "1998 IEEE International Solid-State Circuits Conference, Digest of Technical Papers", pp. 358–359.

In FIG. 2, W1 and W2 denote word lines, and BL1 and BR1 and BL2 and BR2 indicate pairs of bit lines. Memory cells MC1 to MC4 are disposed at intersections of the word lines and the pairs of bit lines. WR1 and WR2 denote write circuits. The write circuit WR1 comprises: an NMOS transistor MNL provided between the bit line BL1 and a power source VSS; an NMOS transistor MNR provided between the bit line BR1 and the power source VSS; NAND gates NW1 and NW2 to which a write control signal WP and data inputs DL1 and DRI are supplied; and inverters IN1 and IN2, which receive outputs of the NAND gates NW1 and NW2. Output signals NL and NR of the inverters IN1 and IN2 are supplied to the gates of the NMOS transistors MNL and MNR, respectively. Although not shown, the write circuit WR2 is constructed in a manner similar to the write circuit WR1.

PR1 and PR2 indicate bit line precharge circuits. The bit line precharge circuit PR1 comprises: a PMOS transistor MP0 provided between the power source VDD and the bit line BL1; a PMOS transistor MP1 provided between the power source VDD and the bit line BR1; and a PMOS transistor MP2 provided between the bit lines BR1 and BL1. A precharge control signal PU is supplied to the gates of the PMOS transistors MP0, MP1 and MP2. Although not shown, the bit line precharge circuit PR2 is constructed in a manner similar to the bit line precharge circuit PR1.

The PMOS transistors will be called precharge PMOS transistors hereinbelow.

FIG. 3 is a diagrammatic sketch of the operations of the conventional technique. The operations of the bit line precharge circuit PR1 and the write circuit WR1, which are connected to the bit lines BL1 and BR1 in the conventional circuit, will be described as an example hereinbelow by using FIGS. 2 and 3.

In a standby mode, all of the word lines, the precharge control signal PU, and the write control signal WP are at a low potential. The precharge PMOS transistors are conductive, the bit lines BL1 and BR1 are at a high potential, and the potential difference (signal amplitude) is zero.

At the time of read operation, first, the precharge control signal PU is set at a high potential and all of the precharge PMOS transistors are made non-conductive. Only one of the word lines corresponding to an address signal is set at a high potential to select a memory cell. In accordance with stored data, a current (cell current) flows to the memory cell from either the bit line BL1 or BR1, so that the potential difference (signal amplitude) occurs between the bit lines. Since the cell current is very small, the signal amplitude of the bit lines at the time of reading operation is small. The signal is generally amplified by a sense amplifier or the like, and the resultant signal is outputted.

At the time of write operation, in a manner similar to the read operation, the precharge control signal PU is set at a high potential to interrupt the precharge PMOS transistors, and only one of the word lines which corresponds to the address signal is set at a high potential. One of the data inputs DL1 or DR1 is at a high potential and the other is at a low potential in accordance with the data to be written. When the write signal WP is set at a high potential, one of the output signals NL or NR of the inverters IN1 and IN2 comes to have a high potential. Consequently, one of the NMOS transistors MNL or MNR is made conductive, and the potential of one of the bit lines BL1 or BR1 is decreased to a low potential, thereby rewriting the data in the memory cell.

After completion of the write and read operations, all of the word lines, write control signal WP, and precharge control signal PU are put back at a low potential, thereby interrupting the memory cell and the write circuit. Further, the precharge PMOS transistors are made conductive, both of the bit lines BL1 and BR1 are precharged to a high potential within a certain time, and the signal amplitude becomes zero (the time required by the operation will be called "recovery time" hereinbelow).

When the read operation is performed after the write operation, the minimum cycle time is determined by the recovery time. In this case, when the cycle time is shortened, at a certain point in time, the read operation of the next cycle starts before the potential difference between the pair of bit lines is reduced to zero. In the read operation, data is read by a signal amplitude of the pair of bit lines. Since the signal amplitude is very small, when the potential difference of the bit lines is not set back to zero at the start of the read operation, data cannot be read normally due to the potential difference. There is the possibility that the access time becomes too long and, in the worst case, data is erroneously read.

As described above, the period since the potential difference between the pair of bit lines is set back to zero in the recovery period after completion of the write operation until the start of read operation of the next cycle in the minimum cycle time. The recovery time is therefore one of the factors which determines the cycle time. For the reduction in cycle time by shortening the recovery time, it is sufficient to increase the size of the precharge PMOS transistor. In this case, however, a load capacity to drive the precharge control signal PUS increases. As a result, delay time caused by making the precharge PMOS transistors non-conductive at the start of read operation increases, and a problem of lengthened access time occurs.

SUMMARY OF THE INVENTION

The object of the invention is to provide a semiconductor memory, such as an SRAM having a bit line precharge circuit for shortening the cycle time without increasing access time.

A representative technique disclosed by the invention to achieve the object is discussed below.

According to the invention, there is provided a semiconductor memory comprising: a plurality of word lines; a plurality of bit lines; memory cells disposed at intersections of the word lines and the bit lines; a write circuit for rewriting data in a memory cell by setting the bit line at a low potential; and a first precharge circuit for putting the bit line back at a high potential after completion of at least a read operation, wherein a second precharge circuit which operates upon detection of completion of a write operation and stops the operation upon detection that the bit line is precharged to a high potential.

In the semiconductor memory, preferably, the second precharge circuit comprises: a first NAND gate to which a bit line signal is supplied; a first inverter to which a write control signal is supplied; a second NAND gate to which an output signal of the first NAND gate and an output signal of the first inverter are supplied; first and second PMOS transistors, both of which are disposed between a power source on a high potential side and a bit line, and have a gate connected to an output of the second NAND gate; and a third PMOS transistor which is provided between bit lines, and whose gate is connected to an output of the second NAND gate.

This object and other objects of the invention will become apparent from the following detailed description and the appended claims by referring to the accompanying drawings. In the accompanying drawings, the same reference numerals denote the same or similar components.

DESCRIPTION OF THE PREFERRED EMBODIMENTS

Figure 1:
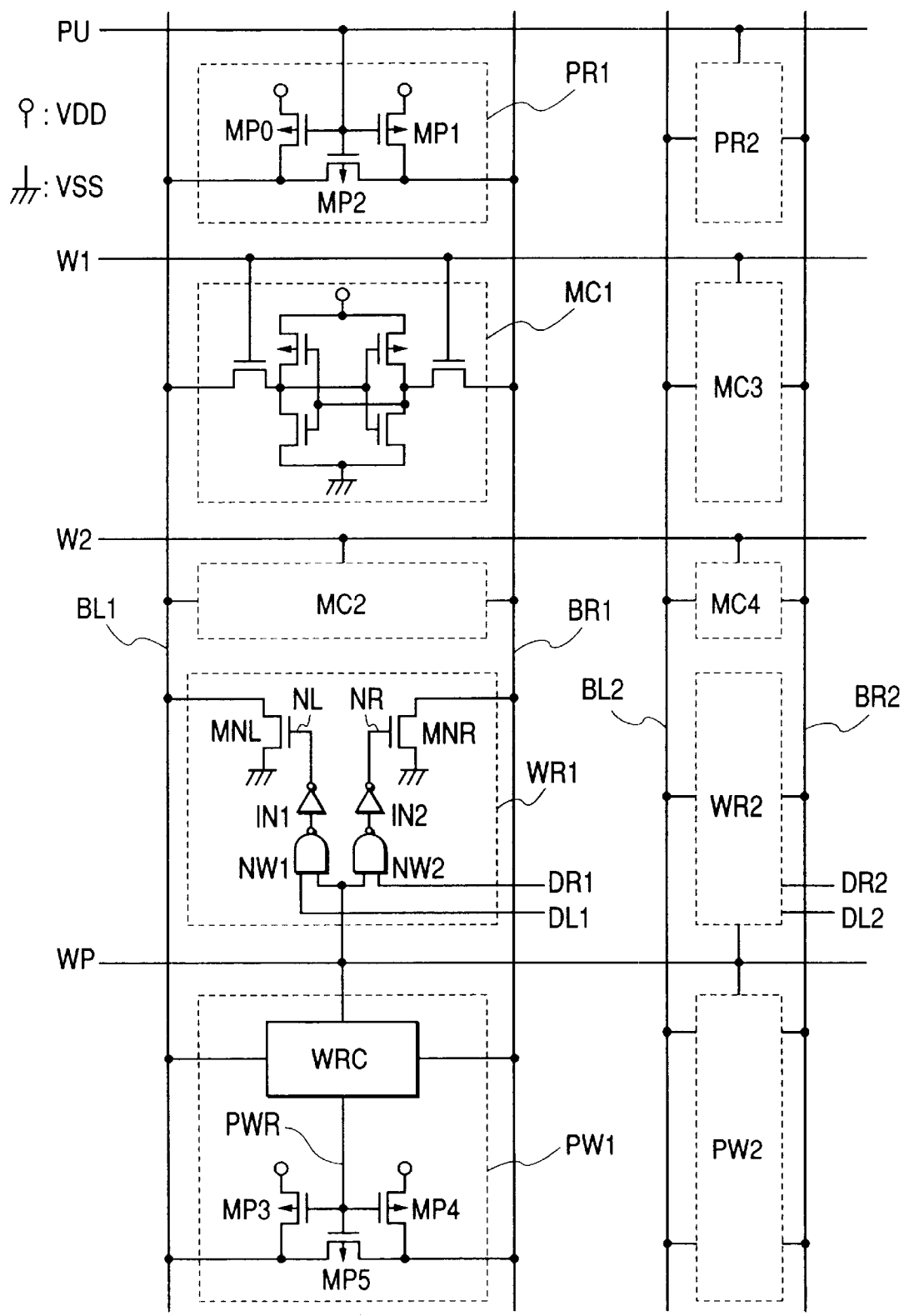
FIG. 1 is a diagram showing a first embodiment of the invention.

FIG. 1 is a circuit diagram showing a first embodiment of the invention. The embodiment has a construction such that other bit line precharge circuits PW1 and PW2 are added to the conventional circuit having the bit line precharge circuits PR1 and PR2. For distinction, PW1 and PW2 will be called precharge circuits for write operation, and PR1 and PR2 will be called precharge circuits.

The precharge circuit PW1 for write operation comprises: a precharge control circuit WRC to which the bit line signals BL1 and BR1 and a write control signal are supplied; a PMOS transistor MP3 provided between the power source VDD and the bit line BR1; a PMOS transistor MP4 provided between the power source VDD and the bit line BL1; and a PMOS transistor MP5 provided between the bit lines BR1 and BL1. An output signal PWR of the precharge control circuit WRC is supplied to the gates of the PMOS transistors MP3, MP4 and MP5. Only when the write control signal is at a low potential and at least one of bit line signals is at a low potential, the precharge control circuit WRC outputs a low potential. Although not shown, the precharge circuit PW2 for write operation is constructed in a manner similar to the precharge circuit PW1.

Figure 3:
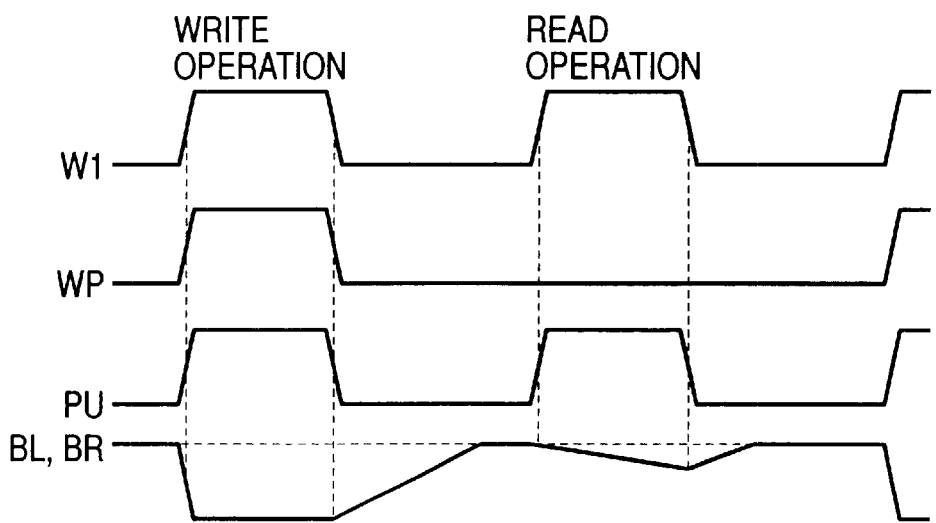
FIG. 3 is a diagrammatic sketch of operations of a conventional technique.
Figure 4:
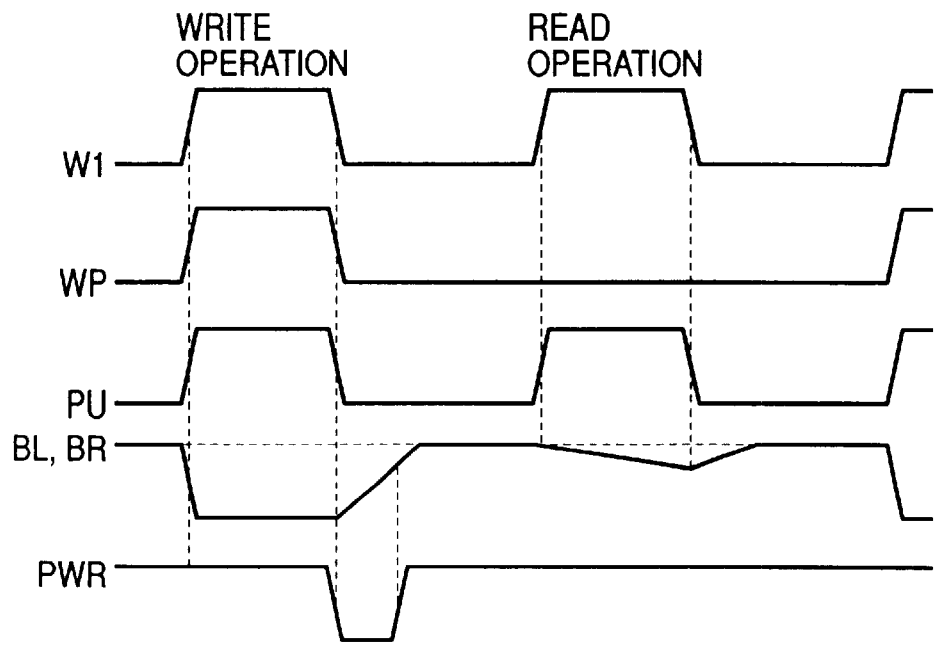
FIG. 4 is a diagrammatic sketch of operations of a first embodiment of the invention.

FIG. 4 is a diagrammatic sketch of the operations of the embodiment. Operation waveforms of the word line signal W1, the write control signal WP, and the precharge control signal PU are similar to those of the conventional technique shown in FIG. 3. The operations of the memory cell MC1, precharge circuit PR1, and write circuit WR1 are the same as those of the conventional technique. On the other hand, the precharge circuit PW1 for write operation operates as set forth below.

The output PWR of the precharge control circuit WRC becomes a low potential only when the write control signal WP is at the low potential and at least one of the bit line signals BL1 and BR1 is at a low potential. That is, the output PWR becomes a low potential only in a period from the end of the write operation until the bit line is precharged to a high potential. Only during this period, the PMOS transistors MP3, MP4 and MP5 in the precharge circuit PW1 for write operation are conductive.

In the recovery period after the read operation, therefore, only the precharge PMOS transistors MP0, MP1 and MP2 are conductive to precharge the bit line. In the recovery period after the write operation, in addition to the PMOS transistors MP0, MP1 and MP2, the PMOS transistors MP3, MP4 and MP5 are also made conductive in order to precharge the bit lines at high speed. In the embodiment, consequently, the recovery time can be shortened and the cycle time can be reduced more than in the conventional technique.

The PMOS transistors MP3, MP4 and MP5 in the precharge circuit PW1 for write operation are made conductive only during the recovery period after the write operation and are not made conductive at the time of read operation and at the time of standby. It is therefore unnecessary to drive the PMOS transistors MP3, MP4 and MP5 when the precharge PMOS transistors are made non-conductive at the start of the read operation. Consequently, in the conventional technique, in the case of enlarging the size of the precharge PMOS transistor in order to shorten the recovery time, the delay time caused by interrupting the precharge PMOS transistors at the start of read operation becomes long, thereby creating a problem of lengthened access times. In the embodiment, however, the cycle time can be shortened without increasing the access time.

Figure 6:
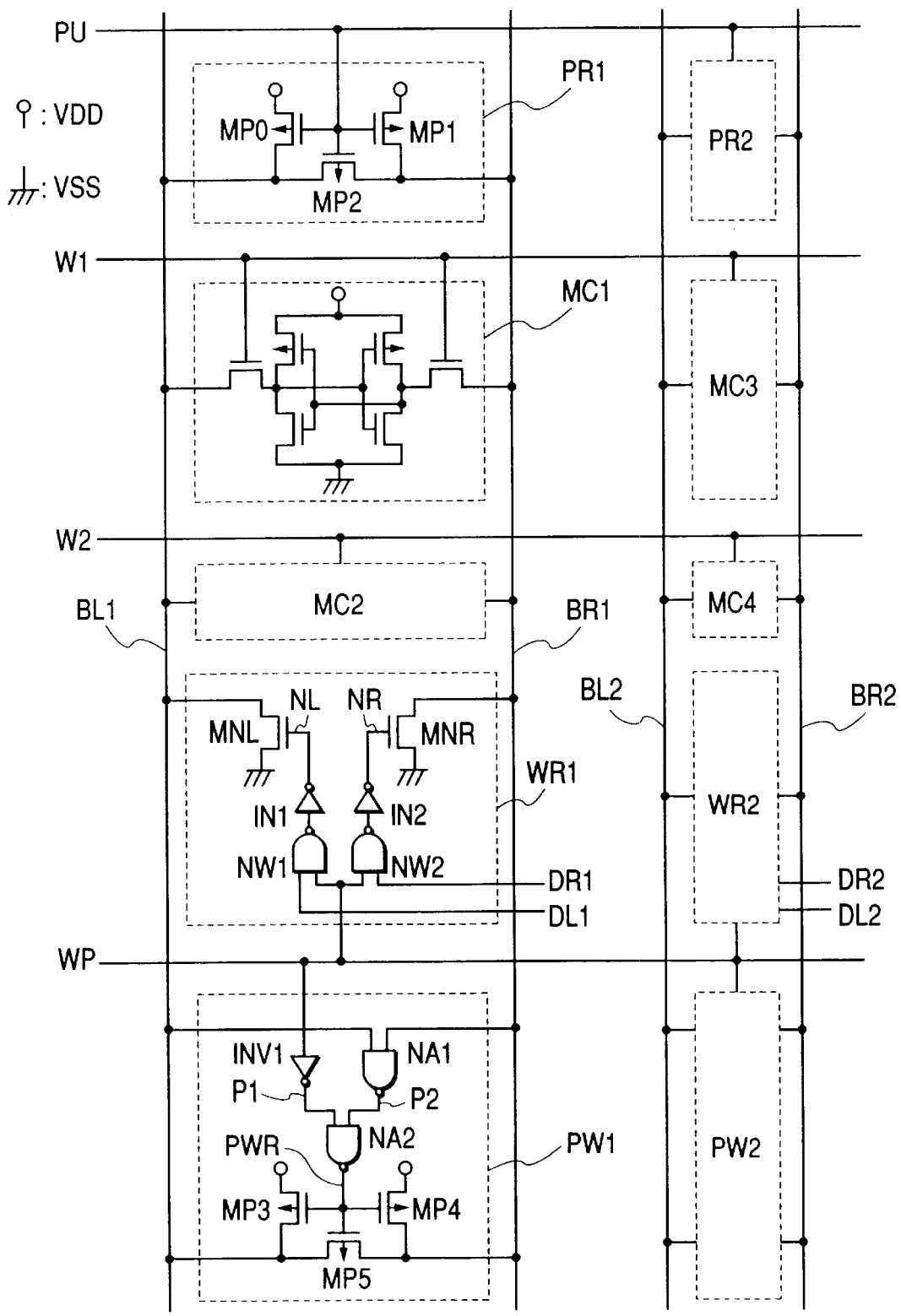
FIG. 6 is a diagram showing a second embodiment of the invention.

FIG. 6 is a circuit diagram showing a second embodiment of the invention, and shows a specific circuit construction of the precharge control circuit WRC in the precharge circuits PW1 and PW2 for write operation in the first embodiment. The precharge control circuit PW1 comprises: a NAND gate NA1 to which the bit line signals BR1 and BL1 are supplied; an inverter INV1 to which the write control signal WP is supplied; and a NAND gate NA2 to which an output signal P2 of the NAND gate NA1 and an output signal P1 of the inverter INV1 are supplied. The output PWR of the NAND gate NA2 is connected to the gates of the PMOS transistors MP3 and MP4, each provided between the power source VDD and the bit line, and the PMOS transistor MP5 provided between the bit lines. Although not shown, the precharge control circuit in the precharge circuit PW2 for write operation is constructed in a manner similar to the precharge control circuit WRC in the precharge circuit PW1.

Figure 7:
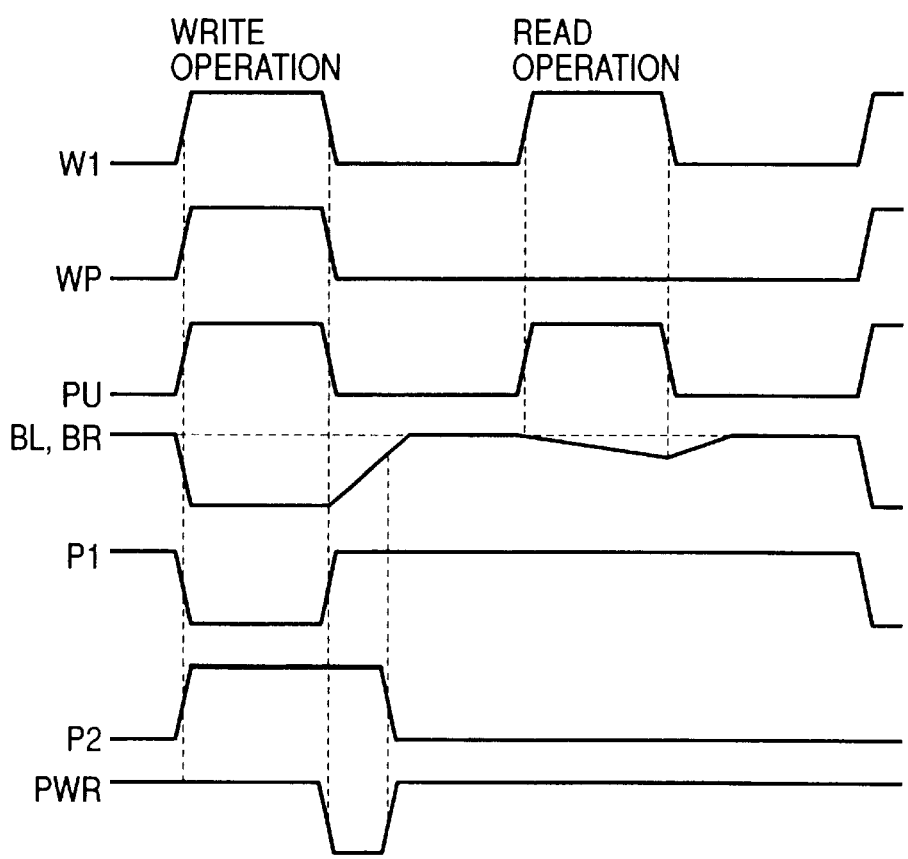
FIG. 7 is a diagrammatic sketch of operations of the second embodiment of the invention.

FIG. 7 shows operation waveforms of the embodiment. The operation of the embodiment will be described hereinbelow by using the diagram. The embodiment relates to a circuit specifically representing the precharge control circuit WRC in the first embodiment. The basic operation is similar to that of the first embodiment. Consequently, only the operation of the precharge control circuit comprising the NAND gates NA1 and NA2 and the inverter INV1 will be described.

An output P2 of the NAND gate NA1 to which the bit line signals BL1 and BR1 are supplied becomes a low potential only when both potentials of the right and left bit lines BR1 and BL1 are at a high potential.

In this case, a logic threshold of the NAND gate NA1 is set to be lower than that bit line potential at the time of reading. Consequently, only during the period from the start of the write operation until the end of the recovery of the bit line, the output P2 of the NAND gate NA1 becomes a high potential. The output P1 of the inverter INV1 is an inversion signal of the write control signal WP, and becomes a high potential when the write operation is not performed.

The output PWR of the NAND gate NA2 to which the outputs P1 and P2 are supplied becomes a low potential only during a period from the end of the write operation until the bit line is precharged to a high potential.

Figure 8:
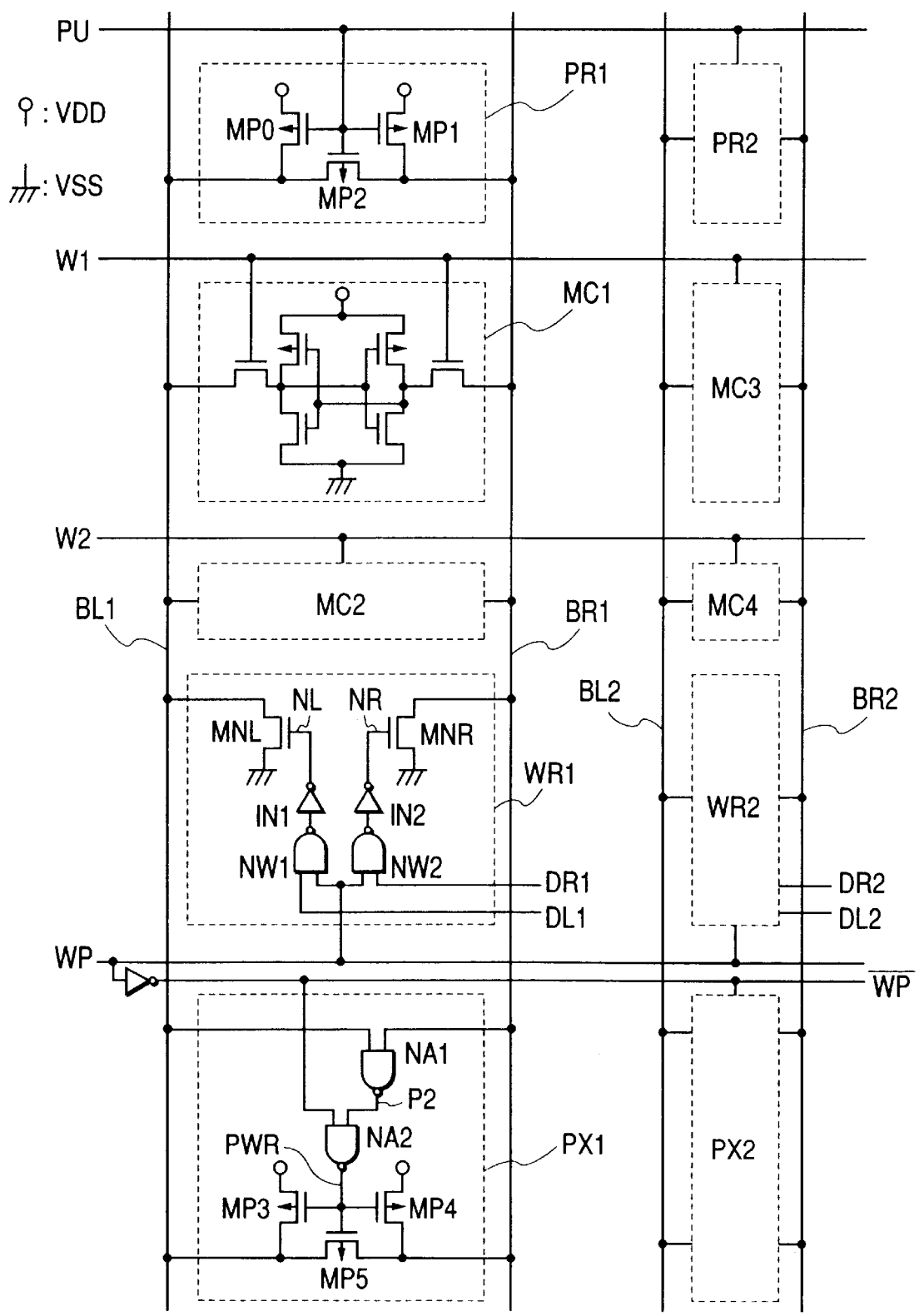
FIG. 8 is a diagram showing a third embodiment of the invention.

FIG. 8 is a circuit diagram showing a third embodiment of the invention. In the second embodiment, a complementary signal of the write control signal WP is generated by the inverter INV1 provided for each of the precharge circuits PW1 and PW2 for write operation. In precharge circuits PX1 and PX2 for write operation of the embodiment, a complementary signal /WP ("/" denotes a sign in place of a bar sign which indicates logical NOT) is generated and supplied by the single inverter INV shared by the precharge circuits PX1 and PX2 for write operation. The number of elements in the precharge circuit for write operation can be consequently decreased as compared with the second embodiment.

Figure 2:
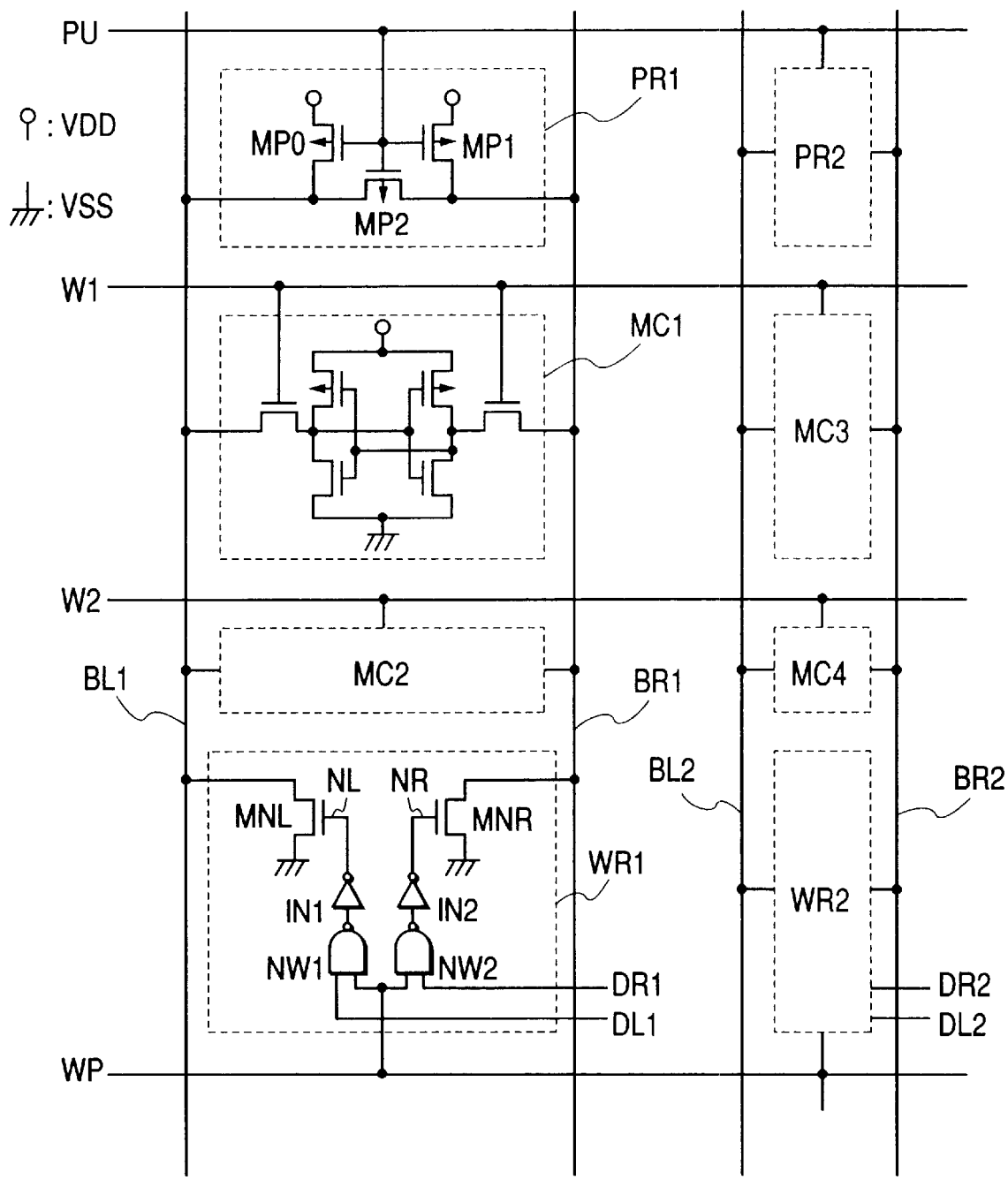
FIG. 2 is a diagram showing a conventional embodiment.
Figure 5:
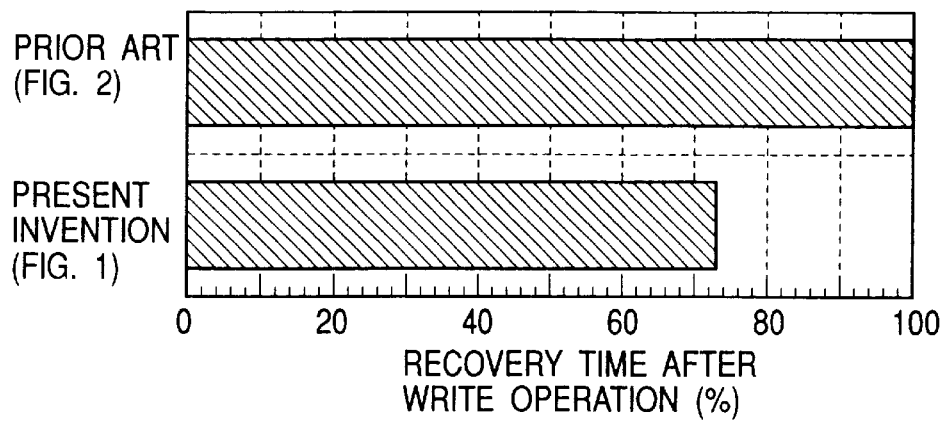
FIG. 5 is a diagram showing effects of the invention.

As obviously understood from the foregoing embodiments, according to the invention, the recovery time after the write operation can be shortened and the cycle time can be reduced without increasing the delay time which makes the precharge PMOS transistors non-conductive at the time of read operation, that is, without increasing the access time. For example, as shown in FIG. 5, in the circuit of FIG. 1 to which the invention is applied, the recovery time after the write operation can be reduced by more than about 25%, as compared with the circuit shown in FIG. 2 of the conventional technique.

Although the preferred embodiments have been described above, the invention is not limited to the embodiments but can be variously designed and changed without departing from the spirit of the invention.

What is claimed is:

1. A semiconductor memory comprising:
a plurality of word lines;
a plurality of bit lines;
memory cells disposed at intersections of the word lines and the bit lines;
a write circuit for rewriting data in a desired memory cell by setting the bit line at a low potential;
a first precharge circuit for putting the bit line back at a high potential after completion of at least a read operation; and
a second precharge circuit which begins a precharge operation upon detection of completion of a write operation and which stops the precharge operation upon detection that the bit line is precharged to the high potential, wherein the second precharge circuit comprises:
a first logic circuit which enters a selection mode when the bit line signal is not precharged to the high potential;
a second logic gate which enters a selection mode when a write operation is not performed and the first logic gate is in the selection mode; and
a transistor for precharging the bit line at the high potential when the second logic gate is in the selection mode.

2. A semiconductor memory comprising:
a plurality of word lines;
a plurality of bit lines;
memory cells disposed at intersections of the word lines and the bit lines;
a write circuit for rewriting data in a desired memory cell by setting the bit line at a low potential;
a first precharge circuit for putting the bit line back at a high potential after completion of at least a read operation; and
a second precharge circuit which begins a precharge operation upon detection of completion of a write operation and which stops the precharge operation upon detection that the bit line is precharged to the high potential, wherein the second precharge circuit comprises:
a first NAND gate to which a bit line signal is supplied;
a first inverter to which a write control signal is supplied;
a second NAND gate to which an output signal of the first NAND gate and an output signal of the first inverter are supplied;
first and second PMOS transistor each of which is disposed between a power source on a high potential side and a bit line and has a gate connected to an output of the second NAND gate; and
a third PMOS transistor which is provided between bit lines and whose gate is connected to an output of the second NAND gate.

3. A semiconductor memory comprising:
a plurality of word lines;
a plurality of bit lines;
memory cells disposed at intersections of the word lines and the bit lines;
a write circuit for rewriting data in a desired memory cell by setting the bit line at a low potential;
a first precharge circuit for putting the bit line back at a high potential after completion of at least a read operation; and
a second precharge circuit which begins a precharge operation upon detection of completion of a write operation and which stops the precharge operation upon detection that the bit line is precharged to the high potential, wherein the second precharge circuit comprises:
a first NAND gate to which a bit line signal is supplied;
a second NAND gate to which an output signal of the first NAND gate and a complimentary signal of a write control signal are supplied;
first and second PMOS transistors each of which is disposed between a high potential side power source line and a bit line and each of which has a gate connected to an output of the second NAND gate; and
a third PMOS transistor which is provided between bit lines and whose gate is connected to an output of the second NAND gate.

4. A semiconductor memory comprising:
a plurality of word lines;
a plurality of bit lines;
memory cells disposed at intersections of the word lines and the bit lines;

a write circuit for rewriting data in a selected memory cell by setting one of the bit lines coupled to said selected memory cell at a low potential;

a first precharge circuit for putting said one bit line at a high potential after completion of a read operation of said selected memory cell and after completion of a write operation of said selected memory cell by using said write circuit; and a second precharge circuit which operates to begin a precharge operation on said one bit line upon detection of completion of the write operation of the selected memory cell and which stops the precharge operation by the second precharge circuit upon detection that the potential of said one bit line is precharged to a level near to the high potential.

5. A semiconductor memory according to claim 4, wherein the second precharge circuit comprises:

a first logic gate which enters a selection mode when the bit line signal is not precharged to the high potential;

a second logic gate which enters a selection mode when a write operation is not performed and the first logic gate is in the selection mode; and a transistor for precharging the bit line at the high potential when the second logic gate is in the selection mode.

6. A semiconductor memory according to claim 4, wherein said second precharge circuit does not carry out a precharge operation following completion of a read operation of the selected memory cell.

7. A semiconductor memory comprising:

a plurality of word lines;

a plurality of bit lines;

memory cells disposed at intersections of the word lines and each pair of the bit lines;

a write circuit for rewriting data in a selected memory cell by setting one bit line of a pair of the bit lines corresponding to the selected memory cell at a low potential;

a first precharge circuit for putting said one bit line of the corresponding pair of the bit lines at a high potential during a precharge period which intervenes between the completion of a write operation period of the selected cell and a next operation period of the selected cell, wherein said next operation period may be either one of a write operation using said write circuit; and a second precharge circuit which operates to begin a precharge operation of said one of the bit lines upon detection of the completion of the write operation of the selected memory cell and which stops the precharge operation upon detection that the potential of said one of bit lines of the corresponding pair of bit lines is precharged to a level near to the high potential.

8. A semiconductor memory according to claim 7, wherein the second precharge circuit comprises:

a first NAND gate to which said pair of bit lines signal is supplied;

a first inverter to which a write control signal is supplied;

a second NAND gate to which an output signal of the first NAND gate and an output signal of the first inverter are supplied;

first and second PMOS transistors each of which is disposed between a power source on a high potential side and each pair of bit lines and each of which has a gate connected to an output of the second NAND gate; and a third PMOS transistor which is provided between the pair of bit lines and whose gate is connected to an output of the second NAND gate.

9. A semiconductor memory according to claim 7, wherein the second precharge circuit comprises:

a first NAND gate to which the pair of bit lines signal is supplied;

a second NAND gate to which an output signal of the first NAND gate and a complementary signal of a write control signal are supplied;

first and second PMOS transistors each of which is disposed between a high potential side power source line and the pair of bit lines and each of which has a gate connected to an output of the second NAND gate; and a third PMOS transistor which is provided between the pair of bit lines and whose gate is connected to an output of the second NAND gate.

10. A semiconductor memory according to claim 7, wherein said second precharge circuit does not carry out a precharge operation following completion of a read operation of the selected memory cell.

11. A semiconductor memory according to claim 7, wherein the first precharge circuit operates to put said one bit line of the corresponding pair of bit lines at a high potential during a precharge period which intervenes between the completion of a read operation period of the selected memory cell and the next operation period of the selected memory cell.

12. A semiconductor memory according to claim 11, wherein said second precharge circuit does not carry out a precharge operation following completion of a read operation of the selected memory cell.

13. A semiconductor memory comprising:

a plurality of word lines;

a plurality of bit lines;

memory cells disposed at intersections of the word lines and the bit lines;

a write circuit for rewriting data in a selected memory cell by setting one of the bit lines coupled to said selected memory cell at a low potential;

first and second precharge circuits coupled to said one bit line of the selected memory cell, wherein both of the first and second precharge circuits operate to perform a precharge operation on said one bit line upon detection of completion of a write operation of the selected memory cell, wherein only the first precharge circuit operates to perform a precharge operation on said one bit line upon detection of completion of a read operation of the selected memory cell, and wherein second precharge circuit stops its precharge operation upon detection that the potential of said one bit line is precharged to a predetermined level.

* * * * *